United States Patent
Park et al.

(10) Patent No.: US 7,563,547 B2
(45) Date of Patent: Jul. 21, 2009

(54) PHOTOMASK AND METHOD OF MANUFACTURING THE SAME

(75) Inventors: Jin-hyung Park, Seongnam-si (KR); Sung-min Huh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 725 days.

(21) Appl. No.: 10/982,851

(22) Filed: Nov. 8, 2004

(65) Prior Publication Data

US 2005/0136341 A1   Jun. 23, 2005

(30) Foreign Application Priority Data

Dec. 20, 2003   (KR) .................. 10-2003-0094270

(51) Int. Cl.
*G03F 1/08* (2006.01)
*G03F 1/14* (2006.01)

(52) U.S. Cl. ......................................................... 430/5
(58) Field of Classification Search ...................... 430/5
See application file for complete search history.

(56) References Cited

U.S. PATENT DOCUMENTS

| | | | |
|---|---|---|---|
| 5,523,184 A * | 6/1996 | Hwang et al. ................... | 430/5 |
| 6,355,382 B1 * | 3/2002 | Yasuzato et al. ................ | 430/5 |
| 2002/0137361 A1 | 9/2002 | Kim et al. | |
| 2008/0057414 A1 * | 3/2008 | Han ............................. | 430/5 |

FOREIGN PATENT DOCUMENTS

| | | |
|---|---|---|
| JP | 11-202469 | 7/1999 |
| KR | 10-0217903 | 6/1999 |
| KR | 1020010044890 A | 6/2001 |

\* cited by examiner

*Primary Examiner*—Mark F Huff
*Assistant Examiner*—John Ruggles
(74) *Attorney, Agent, or Firm*—Volentine & Whitt, PLLC

(57) ABSTRACT

A photomask ensures the transfer of a pattern having a uniform and desired CD onto a substrate from which an electronic device or the like is made. The photomask includes a transparent substrate, a light-shielding film on the front side of the substrate and defining a mask pattern of transmission regions dedicated for pattern formation, and an auxiliary pattern on the front side of the substrate that alters the intensity of the light beam passing through the substrate. After the mask pattern is formed, the photomask is tested to determine variations between the desired (target) CD and the CDs of the features of a pattern transcribed onto a test wafer using the photomask. A density function in which characteristics of the auxiliary pattern to be formed, e.g., the size, depth and/or pitch of recesses, is developed as a prediction of the intensity distribution of the light beam transmitted through the substrate once the auxiliary pattern is present at the front side of the substrate. The photomask is then repaired/corrected by designing and forming the auxiliary pattern according to the density function so as to prevent local or global variations between the desired CD and the actual CD from occurring.

16 Claims, 10 Drawing Sheets

BEFORE CORRECTION → AFTER CORRECTION

BEFORE CORRECTION          AFTER CORRECTION

BEFORE
CORRECTION          CORRECTION          AFTER
CORRECTION

PHOTOMASK AND METHOD OF MANUFACTURING THE SAME

BACKGROUND OF THE INVENTION

1. Field of the Invention

The present invention relates to a photomask for use in the fabrication of microelectronic devices, and to a method of manufacturing the same.

2. Description of the Related Art

Photomasks are essential for fabricating microelectronic devices. Photomasks have mask patterns that correspond to the patterns of various components of the microelectronic devices. In a photolithographic process, the photomask is illuminated with light generated by the light source of optical exposure equipment, whereby the image of the mask pattern is transcribed onto a resist formed on an electronic device substrate (e.g., a wafer from which a microelectronic device is fabricated). Photomasks are being miniaturized as such microelectronic devices become more highly integrated. Accordingly, the sizes of the mask patterns are also becoming smaller. However, an optical proximity effect occurs when the scale of the mask pattern is small. The optical proximity effect limits the resolution of the optical exposure equipment. In other words, the optical proximity effect prevents a pattern, having a shape and CD (critical dimension) corresponding to those of the mask pattern, from being formed on the electronic device substrate.

More specifically, as shown in FIG. 1, shot uniformity on the wafer 7 often varies when a mask pattern 5 of a photomask 3 is transferred to a wafer 7 by a light beam 1 emitted from a light source (for example, a KrF excimer laser or an ArF excimer laser) of optical exposure equipment. (Throughout the specification, the term "shot" refers to the entire pattern created on a wafer by scanning a photomask once.) As a result, elements 9 of the pattern have a CD that is different from the CD of elements 8 of the pattern produced according to the design CD. This discrepancy occurs because even though the light beam 1 has a uniform intensity distribution, the light beam undergoes various optical phenomena as it passes through the photomask 3. As a result, the intensity of the light beam (or an exposure dose) varies according to the location at which the light beam impinges the wafer 7. This effect becomes more pronounced as the design rule of microelectronic devices becomes smaller.

A method for correcting CD variations has been used to obtain a pattern whose portions all have the desired CD. This method generally entails creating a wafer CD map or measuring the CDs of a wafer after the wafer is exposed to a light beam to determine the CD variations, and then etching the back side of the photomask (the incident side) based on the CD variations. However, although etching a broad area of the back side of the photomask can correct global variations in the CD to some extent, such etching can not correct for local CD non-uniformity.

On the other hand, a mask that is unable to form a pattern having the desired CD has been conventionally repaired by irradiating the mask pattern with an ion beam. However, such an ion beam repair cannot provide global correction (even though a local correction is possible) and has a limited number of applications.

SUMMARY OF THE INVENTION

An object of the present invention is to provide a photomask that ensures the transfer of a pattern having a desired CD, along with a high degree of shot uniformity, onto a substrate from which an electronic device or the like is made.

According to one aspect of the present invention, there is provided a photomask including: a substrate transparent to a light beam emitted from an exposure light source and having a front side and a back side, a mask pattern extending along the front side of the substrate and defining transmission regions for pattern formation, and an auxiliary pattern on the front side of the substrate for adjusting the intensity of a light beam entering the substrate at the back side thereof and passing through the substrate.

The auxiliary pattern of the photomask may be formed by recesses in the substrate that decrease the intensity of the light beam passing through the transmission regions and/or by holes in the mask pattern that allow more of the light beam to pass through the substrate. The recesses may be arrayed according to a density function characteristic of the intensity of the light beam entering the back side of the substrate and passing through the transmission regions, wherein the size and depth of the recesses are variables. The holes may be arrayed according to a density function characteristic of the transmittance of the light beam entering the back side of the substrate and passing through the substrate, wherein the size of the holes is a variable.

According to another aspect of the present invention, there is provided a method of manufacturing a photomask, which includes: preparing a substrate transparent to a light beam emitted from an exposure light source and having a front side and a back side, forming a mask pattern defining transmission regions for pattern formation on the front side of the substrate, measuring critical dimensions of individual features of a pattern transferred from the mask pattern onto a wafer, calculating variations between the measured critical dimensions and a target critical dimension, and subsequently forming an auxiliary pattern on the front side of the substrate that will compensate for the variations by adjusting the intensity of the light beam entering the back side of the substrate and passing through the substrate.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
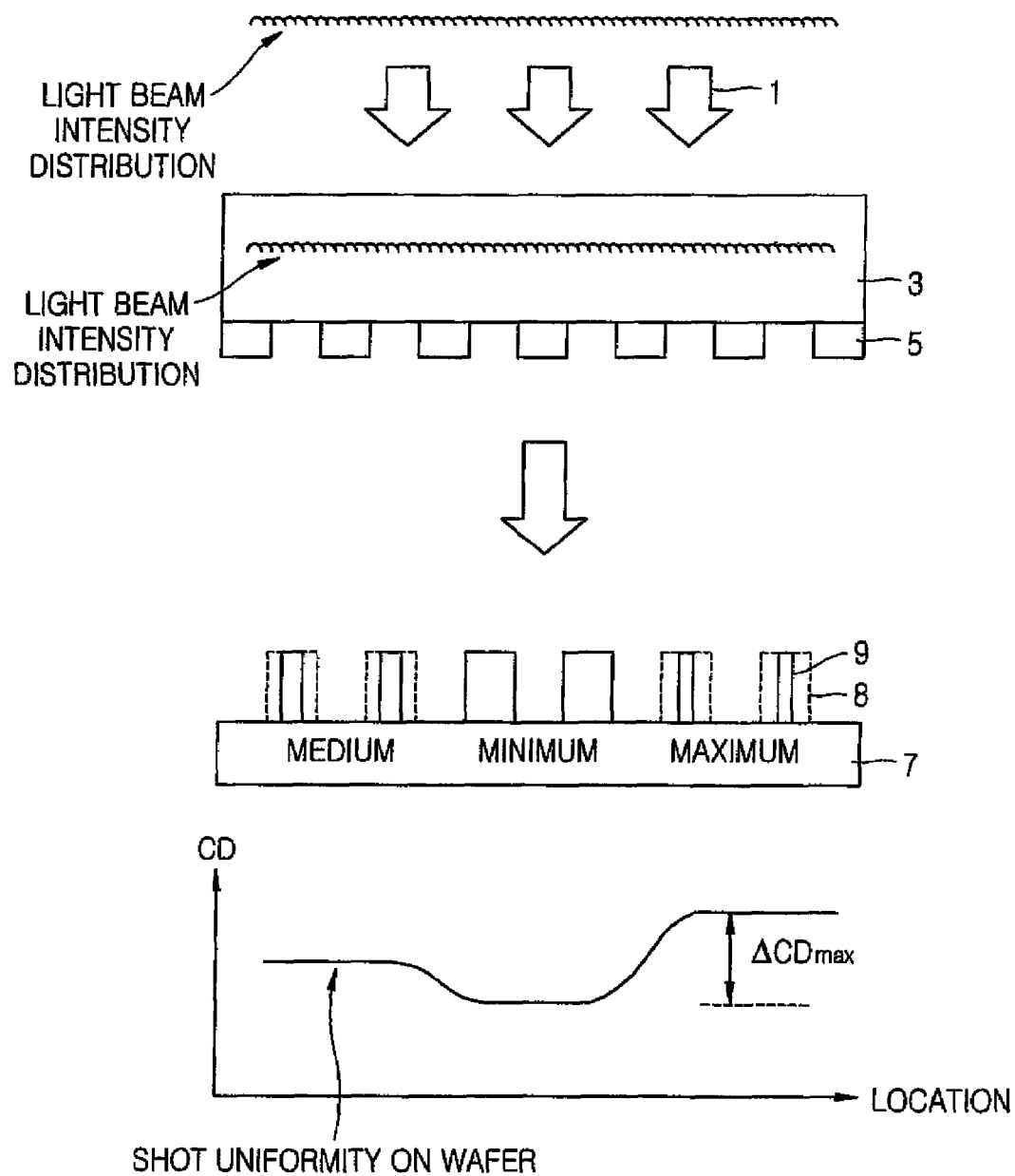
FIG. 1 is a schematic diagram that illustrates shot non-uniformity on a wafer after an exposure process using a conventional photomask.

The present invention will now be described more fully with reference to the accompanying drawings. The same reference numerals designate the same elements throughout the drawings.

Also, the use of the photomask of the present invention will be described mostly in the context of the fabrication of DRAMs (dynamic random access memory) wherein a wafer serves as the substrate to which the mask pattern of the photomask is transferred. Of course, the photomask of the present invention can also be used in the fabrication of highly integrated circuit devices such as SRAM (static random access memory) and flash memory devices, CPUs (central processor units), DSPs (digital signal processors), combination processors comprising CPUs and DSPs, ASICs (application specific integrated circuits), MEMs (micro electro mechanics devices), optoelectronic devices, display devices, and the like.

Generally, a photomask used in the fabrication of DRAM has chip patterns on a photomask substrate. Each of the chip patterns includes a cell array region and a peripheral circuit region. Alignment keys of various shapes are disposed around the chip patterns. Registration measurement keys may be disposed along the outer edges of the chip patterns. For convenience, only the chip patterns are shown in the drawings.

Figure 2A:
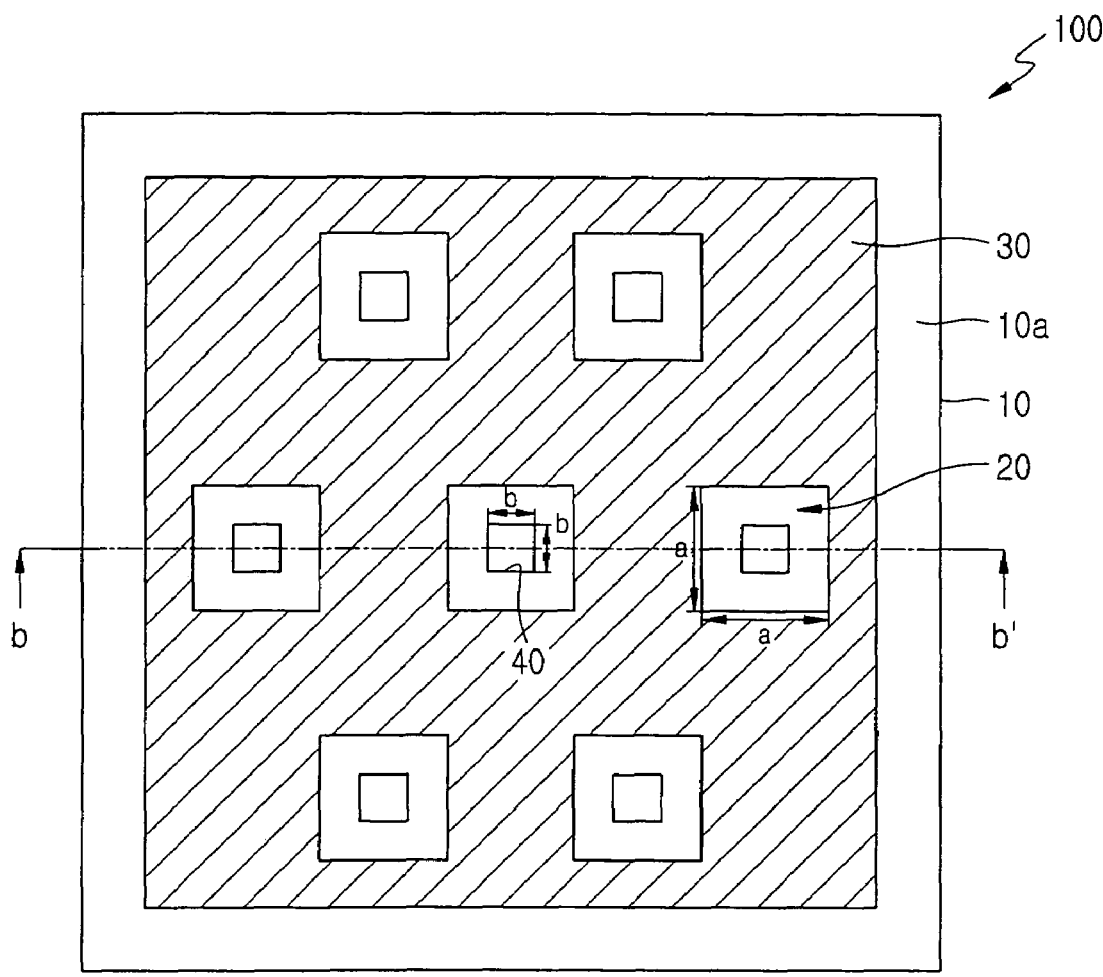
FIG. 2A is a plan view of a first embodiment of a photomask according to the present invention and FIG. 2B is a sectional view taken along line b-b' of FIG. 2A.
Figure 2B:
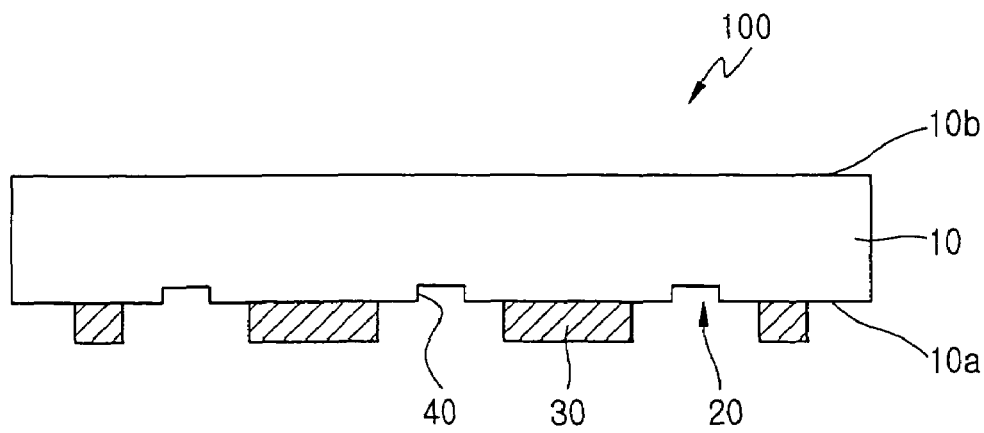

Referring to FIGS. 2A and 2B, the first embodiment of a photomask 100 according to the present invention includes a substrate 10 having a front side 10a and a back side 10b. The substrate 10 is transparent to a light beam emitted by an exposure light source such as an i-line light source, a KrF excimer laser, or an ArF excimer laser. For example, the substrate 10 is made of glass, fused silica, or quartz.

Generally, a photomask used in the fabrication of a DRAM has chip patterns on a photomask substrate. Each of the chip patterns includes a cell array region and a peripheral circuit region. Alignment keys of various shapes are disposed around the chip patterns. Registration measurement keys may be disposed along the outer edges of the chip patterns. For convenience, only the chip patterns are shown in the drawings.

In this embodiment, the transmission regions 20 are square regions whose sides each have a length a. For reference, in the fabricating of DRAMs, a mask pattern is transferred onto a wafer at a 4:1 demagnification. For example, a mask pattern having a CD of 400 μm is transferred onto a wafer in the form of a corresponding pattern having a CD of 100 μm.

In this embodiment, the substrate 10 also has a plurality of recesses 40 in the front side 10a thereof. The recesses 40 constitute an auxiliary pattern in the transmission regions 20. The recesses 40 have the shape of a contact (i.e., an electrical contact to be formed on the wafer). The sides of the recesses 40 each have length b smaller than those of the transmission regions 20. Also, the recesses 40 are located at the centers of the transmission regions 20, respectively. The recesses 40 are formed by dry etching the front side 10a of the substrate 10 using a reactive gas of $CF_4+O_2$.

The auxiliary pattern of the photomask 100 serves to adjust the intensity of a light beam passing through the substrate 10 via the back side 10b of the substrate 10. More specifically, portions of a light beam travel through the substrate 10 at each transmission region 20 along paths having different lengths due to the recesses 40, whereby a phase difference is induced in those portions of the light beam. Therefore, that portion of the light beam passing through the area of the transmission region 20 not occupied by a recess 40 and that portion of the light beam passing through the recess 40 undergo destructive interference due to diffraction. As a result, the intensity of the light beam is decreased.

Such a decrease in the intensity of the light beam results in a corresponding decrease in the CD of the pattern transferred from the mask pattern 30 to the resist on the wafer. In a case in which the image of a mask pattern is transferred onto a wafer by exposing the photomask to light emitted from an i-line light source, the resist is a novolac resin-based photoresist. In the case in which the image of the mask pattern is transferred onto a wafer by exposing the photomask to light emitted from an excimer laser, the resist is a chemical amplification photoresist. Novolac resin-based and chemical amplification photoresists are positive photoresists whose exposed portions are dissolved when the photoresists are developed. In this regard, as the intensity of a light beam, i.e., of the exposure dose, decreases, less of the exposed portions of the photoresist are dissolved, leaving a photoresist pattern having a relatively large line width. Thus, when a target layer underlying the photoresist pattern on the wafer is etched using the photoresist pattern as a mask to form contacts, the CD of the contacts is small. That is, the CD of the contact pattern formed on the wafer is smaller than a.

A correlation between the phase difference ΔΦ induced in the light beam and the depth t of the recesses 40 is given in the following Equation 1:

$$\Delta\Phi = 2\pi(n_f - 1)t/\lambda \qquad (1)$$

wherein $n_f$ is the index of refraction of the substrate 10, and λ is the wavelength of the exposure light source.

For example, when the substrate 10 is made of fused silica, the depth t of the recesses 40 is 2,470 Å, and a KrF excimer laser (wavelength of 248 nm) is used as the exposure light source, a phase difference of 180 degrees is induced in the light beam passing through the transmission regions. Likewise, when the substrate 10 is made of a fused silica, the depth t of the recesses 40 is 1,850 Å, and an ArF excimer laser (wavelength of 193 nm) is used as the exposure light source, a phase difference of 180 degrees is induced in the light beam passing through the transmission regions. When the substrate 10 is made of quartz, the phase difference increases by about 1 degree for every increase of 13.4 Å in the depth of the recesses 40.

As is seen from Equation 1, at the same wavelength, the phase difference ΔΦ increases with increases in the depth of the recesses 40. Also, as was explained earlier, the greater the phase difference ΔΦ becomes, the lower the intensity of the light beam. Furthermore, the greater the size of the recesses 40, the greater is the area of the transmission region that creates the phase difference, and the lower the intensity of the transmitted light beam becomes. Therefore, the greater the depth and the larger the area of the recesses 40, the lower the intensity of a light beam passing through the transmission regions becomes and hence, the smaller the CD of the contact pattern formed on the wafer becomes.

The recesses 40 of the auxiliary pattern of the present invention may have any shape provided that they can alter the intensity of a light beam passing through the substrate 10. That is, the recesses 40 are not limited to being square as in the above-described embodiment of the present invention. Rather, the recesses 40 formed in the transmission regions 30 may be circular, oval, or rectangular. Furthermore, a photomask of the present invention may include two or more auxiliary patterns constituted by respective sets of recesses having different shapes.

Meanwhile, the CDs of elements of the pattern transferred from the photomask 100 to the wafer may vary, i.e., the CD of the pattern may be non-uniform. To prevent the pattern on the wafer from having such a non-uniform distribution of CDs, the photomask 100 is divided into a plurality of sections (or meshes). Preferably, the size and/or depth of the recesses 40 vary among the sections of the photomask according to a density function proportional to the intensity distribution of a light beam passing through the transmission regions 20, i.e., the size and depth of the recesses 40 are variables used to effect different reductions in the intensity of the light beam. That is, even though FIG. 2A shows a photomask in which the transmission regions 20 contain recesses 40 of the same size and depth, the size, depth, and/or number of the recesses 40 can vary amongst the sections of the photomask according to an optimal illumination condition. In this regard, the auxiliary pattern of the present invention can be formed in only one or more local areas of the substrate 10 to improve the uniformity of the CDs of the pattern transferred to the wafer.

Figure 3:
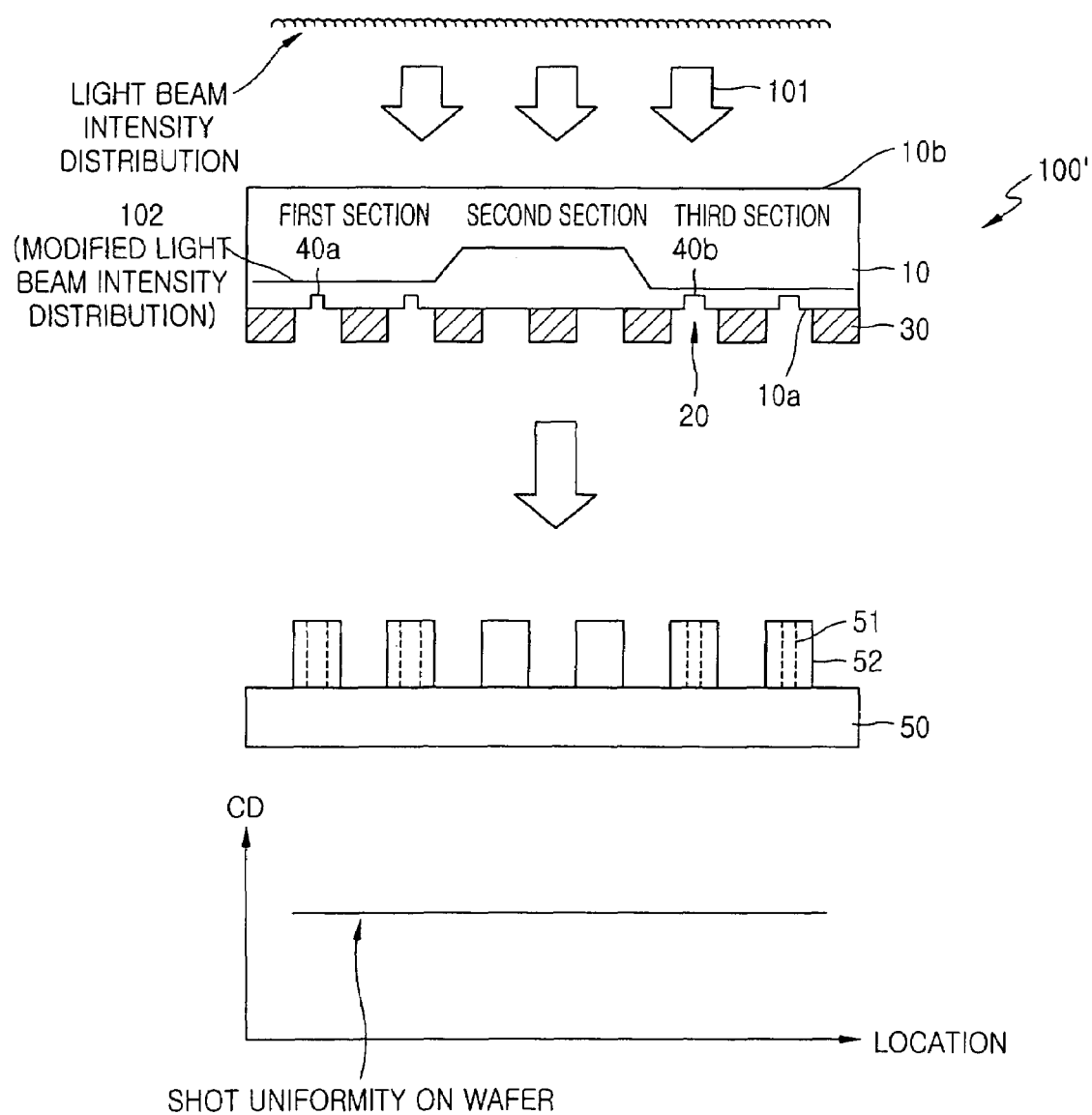
FIG. 3 is a schematic diagram that illustrates shot uniformity accomplished on a wafer using a second embodiment of a photomask according to the present invention.

In particular, FIG. 3 shows a modified photomask 100' that improves the shot uniformity compared to the case in which the photomask shown in FIG. 1 is used. The modified photomask 100' includes a first section having first recesses 40*a*, a second section devoid of recesses, and a third section having second recesses 40*b*. The intensity of a light beam 101 emitted by an exposure light source changes while passing through the transmission regions containing the first and second recesses 40*a* and 40*b*. The "density" of the first recesses 40*a* is smaller than that of the second recesses 40*b*. The density of the recesses 40*a*, 40*b* in each respective section of the photomask 100' is a measure of the depth, number and size of the recesses in each section. Thus, the recess density can be adjusted by varying the depth and/or number of recesses of the same size or by varying the size and/or number of recesses having the same depth in a section of the photomask.

The recesses 40 of the auxiliary pattern of the present invention may have any shape provided that they can alter the intensity of a light beam passing through the substrate 10. That is, the recesses 40 are not limited to being square as in the above-described embodiment of the present invention. Rather, the recesses 40 formed in the transmission regions 20 may be circular, oval, or rectangular. Furthermore, a photomask of the present invention may include two or more auxiliary patterns constituted by respective sets of recesses having different shapes.

Figure 4A:
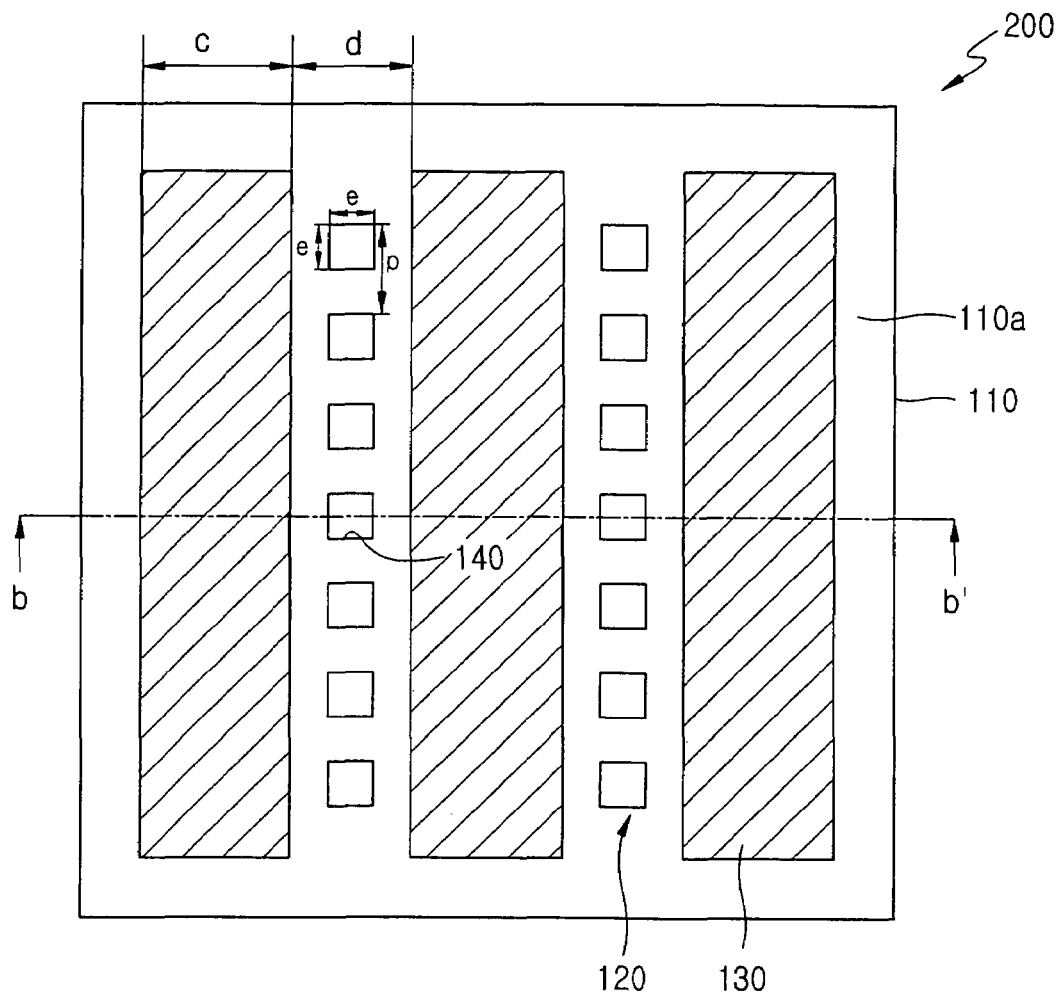
FIG. 4A is a plan view of a third embodiment of a photomask according to the present invention and FIG. 4B is a sectional view taken along line b-b' of FIG. 4A.
Figure 4B:
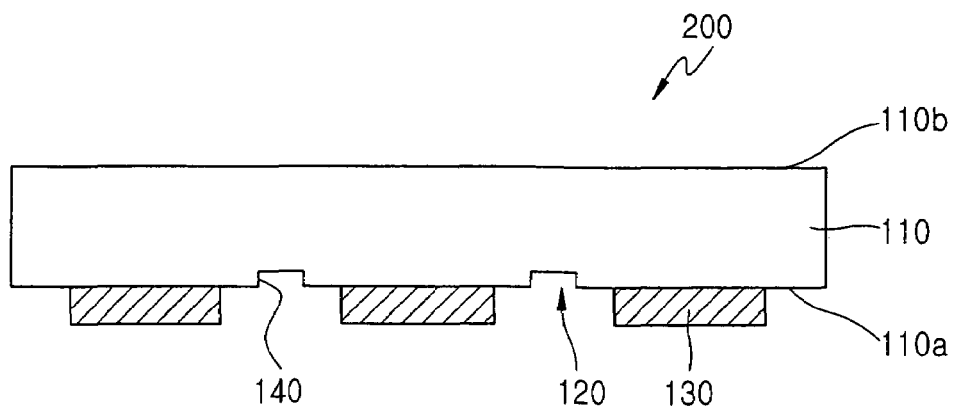

A photomask of the present invention can also have a mask pattern in the form of lines and spaces as shown in FIG. 4A and FIG. 4B, wherein the spaces constitute transmission regions of the photomask. Referring to FIGS. 4A and 4B, a photomask 200 according to the present invention includes a substrate 110 having a front side 110*a* and a back side 110*b*. The substrate 110 is transparent to a light beam emitted from an exposure light source.

A mask pattern 130 defining transmission regions 120 extends over the front side 110*a* of the substrate 110. The mask pattern 130 may be a film that blocks 100% of the incident light (as in the case of a binary mask) or a half-tone film (as in the case of a half-tone phase shift mask). In this embodiment, the mask pattern 130 and the transmission regions 120 form lines having a line width c and spaces having a line width d, respectively.

In this embodiment, a plurality of recesses 140 are formed in the front side 110*a* of the substrate 110. The recesses 140 constitute an auxiliary pattern in the transmission regions 120. The sides of the recesses 140 each have a length e and the recesses 140 are spaced from each other in a transmission region 120 with a predetermined pitch p. In this embodiment, the length e of the sides of the recesses 140 is smaller than the line width d of the transmission regions 120. Alternatively, though, the length e of the sides of the recesses 140 may be the same as the line width d of the transmission regions 120.

The recesses 140 create a phase difference between different portions of the light beams passing through the transmission regions 120, like the recesses 40 of the first embodiment. Therefore, that portion of the light beam passing through the area of a transmission region 120 not occupied by the recesses 140 and that portion of the light beam passing through the recesses 140 in the transmission region 120 undergo destructive interference due to diffraction, thereby decreasing the intensity of the transmitted light beam. As a result, the pattern transferred to a wafer from the photomask 200 comprises a series of lines having a CD larger than the line width c, and a series of spaces having a CD smaller than the line width d.

The greater the depth of the recesses 140, the greater the phase difference becomes, and the greater the decrease in the intensity of the light beam becomes. Furthermore, the greater the size of the recesses 140, the greater the decrease in the intensity of the light beam becomes. Furthermore, the smaller the pitch of the recesses 140, i.e., the greater the number of the recesses 140 in a transmission region becomes, and the greater the decrease in the intensity of the light beam becomes. That is, the decrease in the intensity of the transmitted light beam depends on the depth (phase difference), size, and pitch of the recesses 140.

In addition, as described in connection with the embodiment of FIG. 3, to prevent the pattern on the wafer from having a non-uniform distribution of CDs, the photomask 200 is divided into a plurality of sections. Preferably, the depth, size and/or pitch of the recesses 40 vary among the sections of the photomask according to a density function proportional to the intensity distribution of a light beam passing through the transmission regions 120, i.e., the depth, size and/or pitch of the recesses 140 are variables used to effect different reductions in the intensity of the light beam. That is, even though FIG. 4A shows a photomask in which the transmission regions 120 contain recesses 140 of the same shape, size, and pitch, the size, depth, and/or the pitch of the recesses 140 can vary amongst the sections of the photomask so as to effect an optimal illumination condition.

Figure 5A:
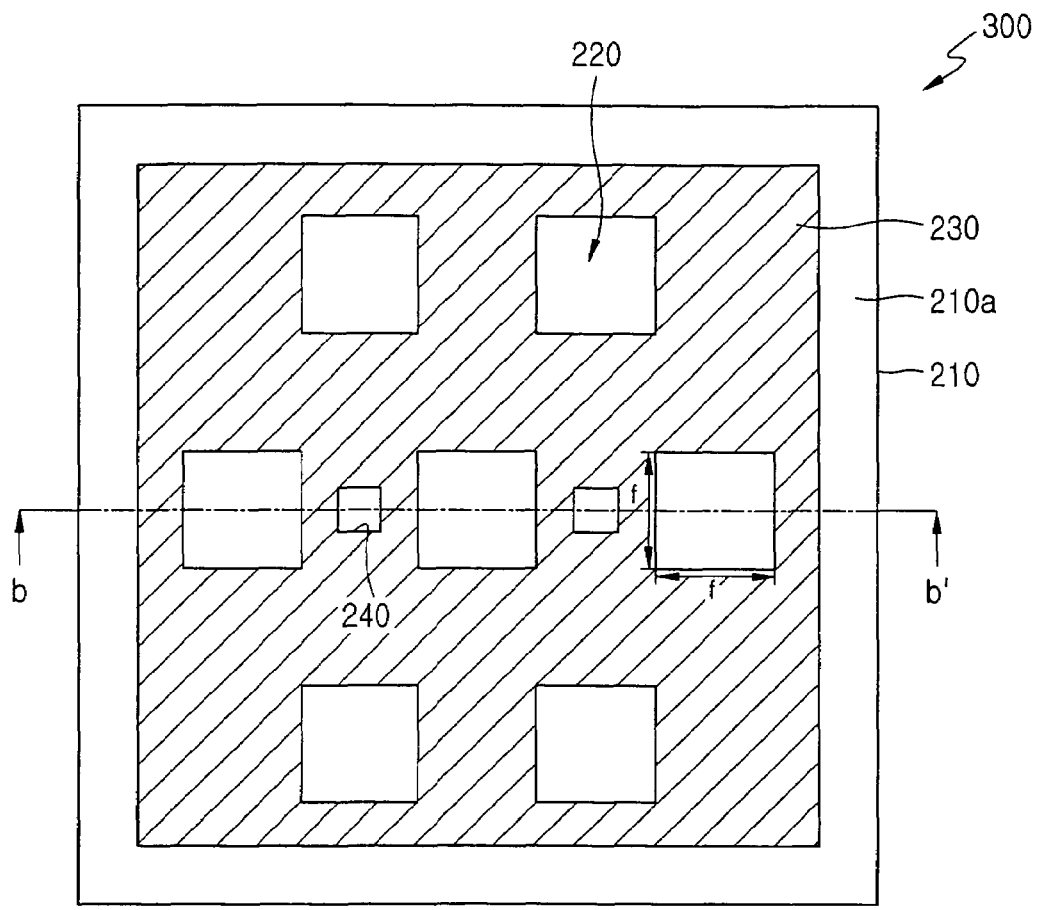
FIG. 5A is a plan view of a fourth embodiment of a photomask according to the present invention and FIG. 5B is a sectional view taken along line b-b' of FIG. 5A.
Figure 5B:
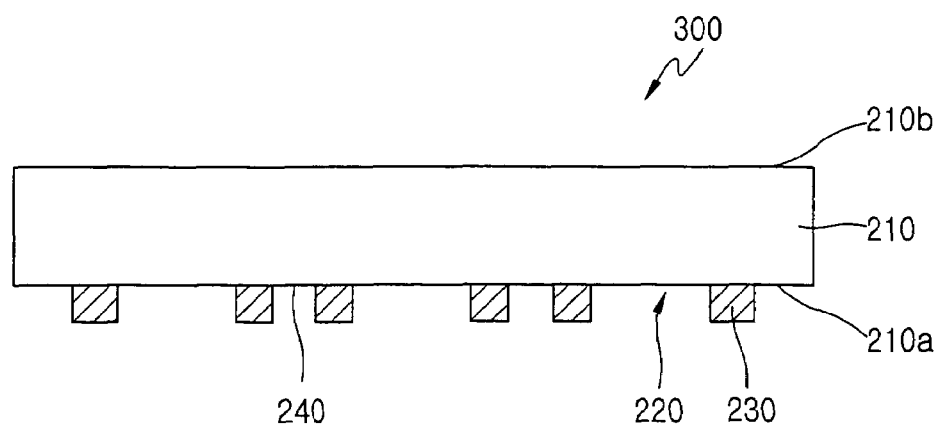

FIGS. 5A and FIG. 5B show a fourth embodiment of a photomask 300 according to the present invention. Referring to FIGS. 5A and 5B, the photomask 300 includes a substrate 210 having a front side 210*a* and a back side 210*b*. The substrate 210 is transparent to a light beam emitted from an exposure light source and may be made of glass, fused silica, or quartz.

A mask pattern 230 extends over the front side 210*a* of the substrate 210. The mask pattern 230 defines transmission regions 220. The mask pattern 230 may be of a film that blocks 100% of the exposure light (as in the case of a binary mask) or may be a half-tone film that blocks only a portion of the exposure light (as in the case of a half-tone phase shift mask). In this embodiment, the transmission regions 220 are in the form of a pattern of contacts whose sides each have a length f.

Also, in this embodiment, a plurality of holes 240 are formed in the mask pattern 230 so as to expose the front side 210a of the substrate 210. The holes 240 constitute an auxiliary pattern. The holes 240 thus decrease the light-shielding region of the photomask 300, whereby a greater amount of light passes through the substrate 210. The increase in the intensity of the light results in a correspondingly smaller CD of the pattern transferred from the mask pattern 230 to a wafer. That is, the contacts of the pattern transferred from the transmission regions 220 to the wafer have a CD larger than the length f of the sides of the transmission regions 220.

Furthermore, the CD of the pattern transferred from the photomask 300 to the wafer may be non-uniform. To prevent the pattern on the wafer from having such a non-uniform distribution of CDs, the photomask 300 is divided into a plurality of sections. Preferably, the "density" of the recesses 240 vary among the sections of the photomask according to a density function proportional to the intensity distribution of a light beam passing through the transmission regions 220, i.e., the sizes of the recesses 240 are variables used to effect different reductions in the intensity of the light beam. That is, even though FIG. 5A shows a photomask in which the holes 240 have the same shape and size, the size of the holes 240 can vary among the sections of the photomask to effect an optimal illumination condition.

Figure 6:
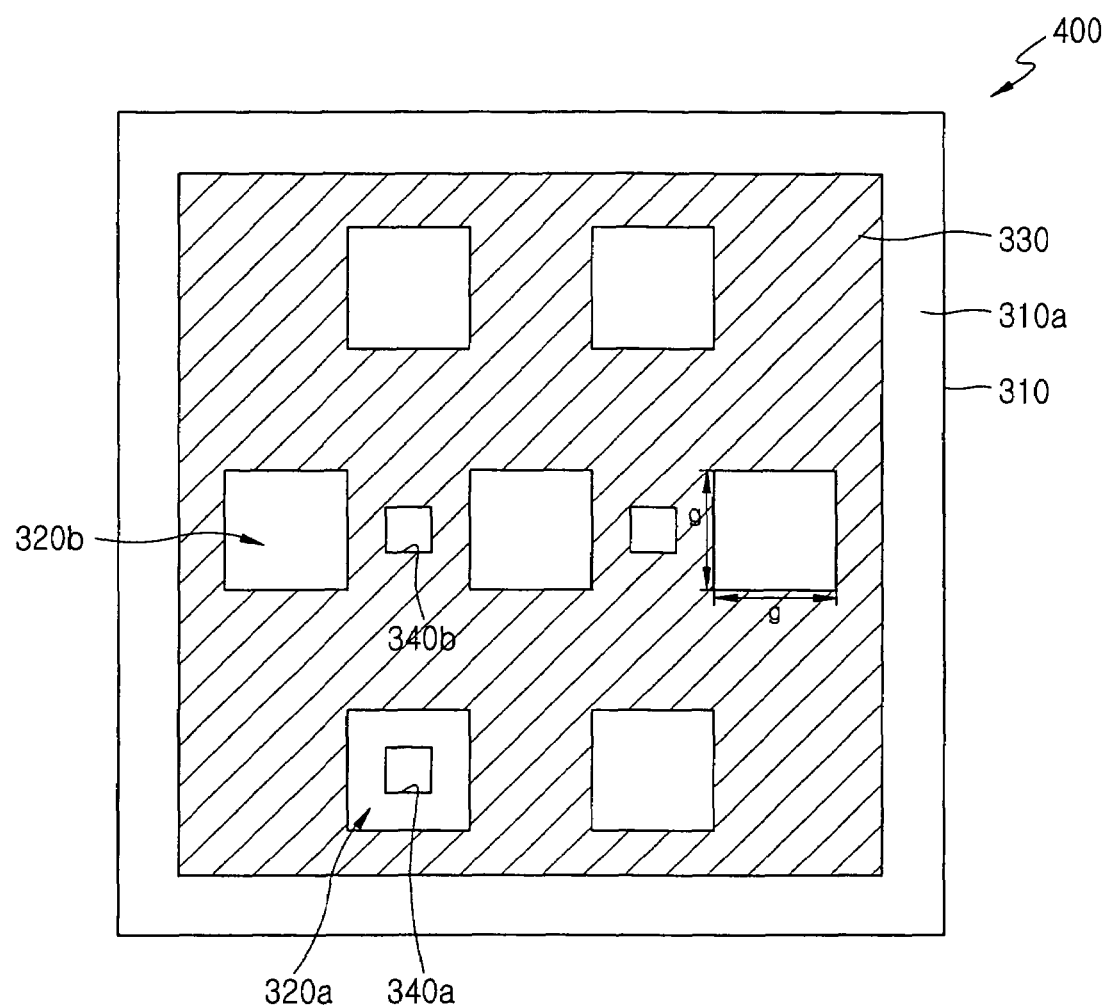
FIG. 6 is a plan view of a fifth embodiment of a photomask according to the present invention.

A fifth embodiment of a photomask 400 according to the present invention, as shown in FIG. 6, includes recesses 340a formed in select ones of the transmission regions 320a, and holes 340b formed in the mask pattern 330. Both the transmission regions 320a containing the recesses 340a and the transmission regions 320b devoid of recesses constitute a contact pattern and have sides each having a length g.

The "density" of the recesses 340a vary among the sections of the Photomask according to a density function proportional to the intensity distribution of a light beam passing through the transmission regions 320a, i.e., the sizes and depths of the recesses 340a are variables used to effect different reductions in the intensity of the light beam. Therefore, the CD of a contact pattern transferred from the transmission regions 320a to a wafer is smaller than the length g. Also, the "density" of the holes 340b varies among the sections of the photomask according to the density function. In this case, the sizes of the holes 340b are variables used to effect different increases in the intensity of the light beam. Therefore, the CD of the contact pattern transferred from each transmission region 320a around the holes 340b to the wafer is larger than g. In this way, the density function has variables by which both local and global variations in the CD can be corrected.

Hereinafter, a method of manufacturing a photomask including an auxiliary pattern according to the present invention will be described with reference to FIG. 7 and FIGS. 8A through 8D.

Figure 7:
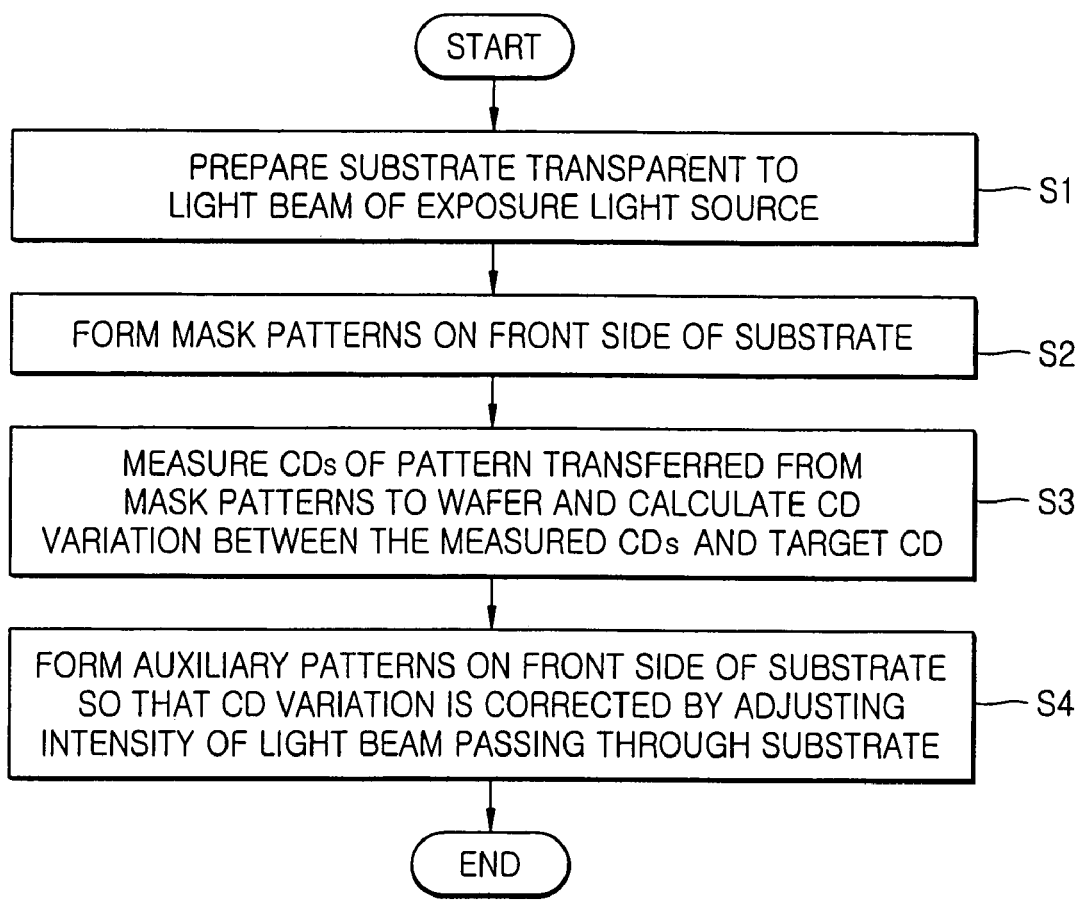
FIG. 7 is a flowchart that illustrates a method of manufacturing a photomask according to the present invention.
Figure 8A:
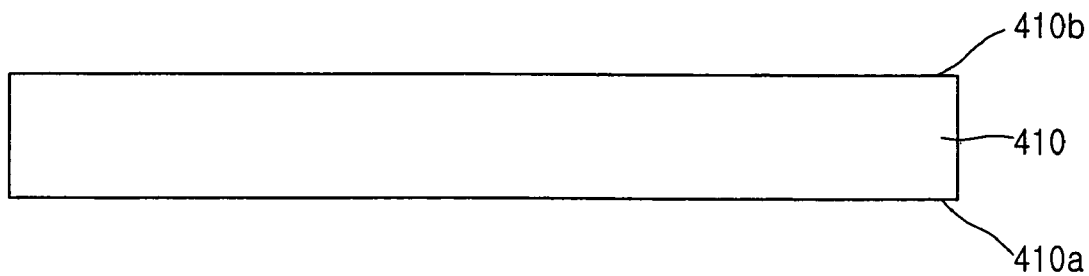
FIGS. 8A through 8D are sectional views that illustrate the steps of the method shown in FIG. 7.

Referring first to FIGS. 7 and 8A, first, a substrate 410 that is transparent to a light beam emitted from an exposure light source is prepared (step S1). The substrate 410 has a front side 410a and a back side 410b. The substrate 410 may be made of glass, fused silica, or quartz.

Figure 8B:
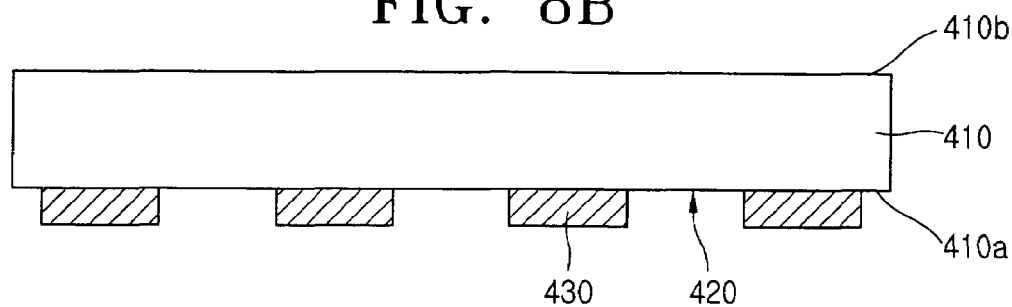

Next, referring to FIGS. 7 and 8B, a mask pattern 430 defining transmission regions 420 are formed on the front side 410a of the substrate 410 (step S2). For example, a 100% light-shielding film made of aluminum, tungsten, or chromium or a half-tone light-shielding film made of MoSiN or MoSiON is formed on the front side 410a of the substrate 410. The film is then patterned by an e-beam or a laser.

Figure 8C:
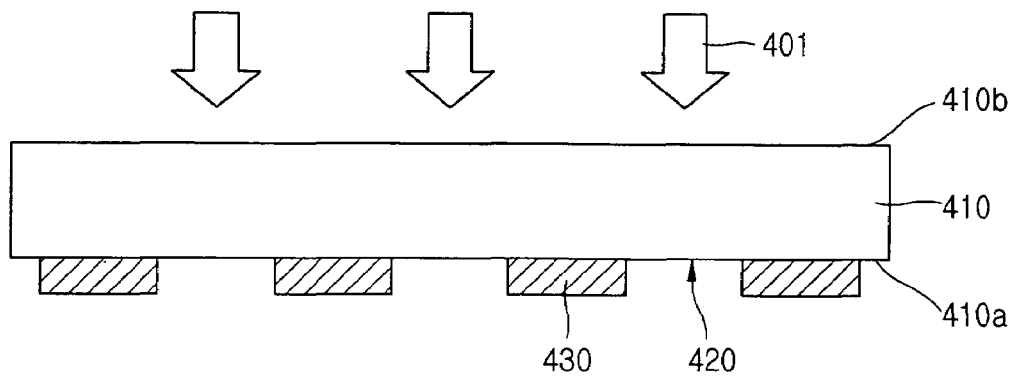
Figure 8C:
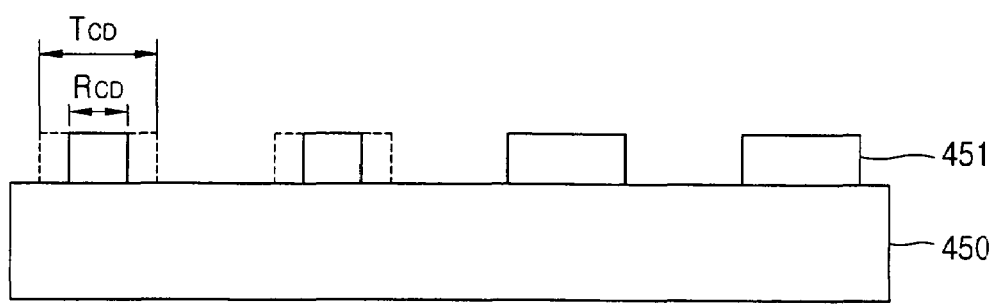

Next, referring to FIGS. 7 and 8C, a photolithography process is performed in which a light beam 401 is directed onto the back side 410b of the substrate 410 to transfer an image of the mask pattern 430 onto a test wafer 450, and the image is used to form a pattern 451 on the wafer 450. Then, the actual CDs ($R_{CD}$) of the elements of the pattern 451 are measured, and the measurements are used to calculate the variations between the $R_{CD}$ and the target CD ($T_{CD}$) (step S3). For illustrative purposes only, the elements of the pattern 451 on the left side of FIG. 8C are shown as having actual CDs ($R_{CD}$) smaller than the target CD ($T_{CD}$). The variations can also be determined by developing a CD map instead of carrying out the above-described calculations.

Figure 8D:
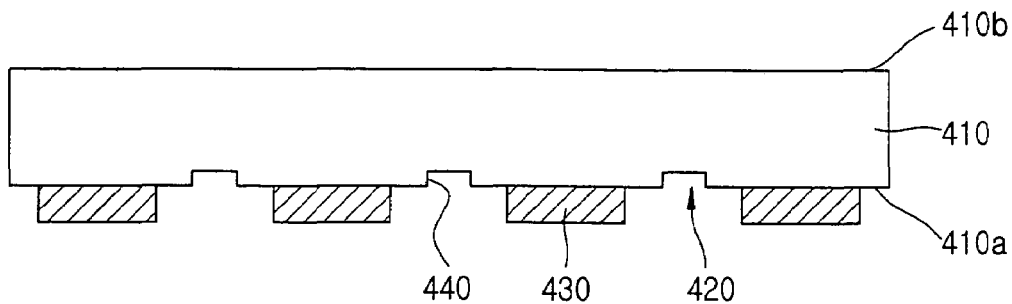

Finally, referring to FIG. 7 and 8D, an auxiliary pattern 440 such as a series of recesses, holes, or a combination thereof are formed at the front side 410a of the substrate 410 so that the CD variations are prevented by changing the intensity of the light beam 401 entering the back side 410b of the substrate 410 and passing through the substrate 410 (step S4).

In this example, the actual CDs of the elements of the pattern 451 shown on the left side of FIG. 8C are smaller than the target CD. Therefore, recesses 440 are formed in the transmission regions 420 to decrease the intensity of the light beam 401 passing through the transmission regions 420, as shown in FIG. 8D. For example, the front side 410a of the substrate 410 is coated with a resist (not shown), and then the resist is patterned by a laser or an e-beam to expose desired portions of the substrate 410 within the transmission regions 420. The exposed portions of the front side 410a of the substrate 410 are etched using the resist pattern as an etching mask to form the recesses 440. For example, a reactive dry etching method using a $CF_4+O_2$ gas that does not create cracks in the substrate may be used. The front side 410a of the substrate 410 is preferably etched using a multi-step etching process. In this process, the etching rate determined in one step (a first etch) is used to carry out the next step (the subsequent etch). Therefore, the etching will produce the exact depth of the recesses necessary to effect the desired phase difference.

Note, although FIG. 8D shows the recesses 440 formed in all of the transmission regions 420, this may obviously not be the case in manufacturing a photomask that will form a pattern having uniform CDs. That is, the photomask 410 will most likely be corrected by dividing the photomask 410 into several sections and varying the density of the features constituting the auxiliary pattern, e.g., the density of the recesses 440, according to the variations in the actual CDs of the pattern 451 of the test wafer 450.

Hereinafter, the present invention will be described more specifically with reference to Experimental Examples. Technical details of the examples that can be easily deduced by persons of ordinary skill in the art are omitted for the sake of brevity.

EXPERIMENTAL EXAMPLE 1

Simulations with solid-C were conducted for the photomask 100 shown in FIGS. 2A and 2B. The exposure equipment was specified as having a numeric aperture (NA) of 0.7 and a KrF (248 nm) exposure light source. The beam-passing region was an annular region having an aperture (diameter σ) of 0.55σ to 0.85σ (indicated as 0.85/0.55). Also, the mask pattern 30 was specified as an 8% half-tone shielding film and the size a of the transmission regions 20 was kept at 0.25 μm. Table 1 below summarizes the results of the simulations of the transfer of patterns from the transmission regions 20 onto a wafer, for different sizes b (0.05, 0.1, and 0.15 μm) of the recesses 40 and different phase differences (10, 20, and 30 degrees) based on varying depths of the recesses 40.

TABLE 1

CD values of 0.25 μm contact pattern with respect to the size and depth of recesses

| P.D. | S.R. | | |
|---|---|---|---|
| | 0.05 μm | 0.1 μm | 0.15 μm |
| 10 degrees | 0.249 μm | 0.249 μm | 0.248 μm |
| 20 degrees | 0.249 μm | 0.247 μm | 0.246 μm |
| 30 degrees | 0.247 μm | 0.243 μm | 0.240 μm |

P.D: phase difference
S.R: size of recesses

As seen from Table 1, the recesses 40 formed in the transmission regions 20 would help to create a contact pattern having smaller CDs (0.240-0.249 μm) than the size a (0.25 μm) of the transmission regions 20. This indicates that the recesses 40 can alter the CDs of the contact pattern, otherwise produced using the 0.25 μm transmission regions 20 alone, by up to 1 to 10 nm. In particular, it can be seen that a local CD variation correction is possible using the size and depth of the recesses 40 as variables.

EXPERIMENTAL EXAMPLE 2

Simulations with solid-C were conducted for the photomask 200 shown in FIGS. 4A and 4B. The exposure equipment was specified as having an NA of 0.7 and a KrF (248 nm) exposure light source. The aperture of the beam-passing region was specified as 0.92/0.67. The mask pattern 130 was specified as an 8% half-tone shielding film, the size c of the mask pattern 130 was 0.385 μm, and the size d of the transmission regions 120 was 0.125 μm. Tables 2, 3, and 4 below summarize the results of simulations of the transfer of the line and space pattern onto a wafer, for different pitches p (0.2, 0.4, and 0.6 μm) of the recesses 140, phase differences (10, 20, 30, and 40 degrees), and different sizes of the recesses 140 of 0.05, 0.075, and 0.1 μm, respectively.

TABLE 2

CD values of 0.125 μm space pattern with respect to the depth and pitch of 0.05 μm recesses

| P.D. | Pitch | | |
|---|---|---|---|
| | 0.2 μm | 0.4 μm | 0.6 μm |
| 10 degrees | 0.123 μm | 0.124 μm | 0.125 μm |
| 20 degrees | 0.118 μm | 0.121 μm | 0.124 μm |
| 30 degrees | 0.107 μm | 0.115 μm | 0.122 μm |
| 40 degrees | 0.090 μm | 0.107 μm | 0.120 μm |

P.D: phase difference

TABLE 3

CD values of 0.125 μm space pattern with respect to the depth and pitch of 0.075 μm recesses

| P.D. | Pitch | | |
|---|---|---|---|
| | 0.2 μm | 0.4 μm | 0.6 μm |
| 10 degrees | 0.123 μm | 0.124 μm | 0.125 μm |
| 20 degrees | 0.116 μm | 0.122 μm | 0.125 μm |

TABLE 3-continued

CD values of 0.125 μm space pattern with respect to the depth and pitch of 0.075 μm recesses

| P.D. | Pitch | | |
|---|---|---|---|
| | 0.2 μm | 0.4 μm | 0.6 μm |
| 30 degrees | 0.104 μm | 0.119 μm | 0.124 μm |
| 40 degrees | 0.080 μm | 0.114 μm | 0.123 μm |

P.D.: phase difference

TABLE 4

CD values of 0.125 μm space pattern with respect to the depth and pitch of 0.1 μm recesses

| P.D. | Pitch | | |
|---|---|---|---|
| | 0.2 μm | 0.4 μm | 0.6 μm |
| 10 degrees | 0.123 μm | 0.125 μm | 0.125 μm |
| 20 degrees | 0.116 μm | 0.124 μm | 0.124 μm |
| 30 degrees | 0.102 μm | 0.123 μm | 0.123 μm |
| 40 degrees | 0.078 μm | 0.122 μm | 0.120 μm |

P.D: phase difference

As seen from Tables 2 through 4, the recesses 140 formed in the transmission regions 120 were responsible for the formation of a space pattern having CDs equal to or (0.078-0.125 μm) smaller than the size d (0.125 μm) of the transmission regions 120. In particular, it can be seen that a local or global CD variation correction is possible using the size, depth, and pitch of the recesses 140 as variables. Consequently, the simulations show that when a CD variation in a cell array region and a CD variation between the cell array region and a peripheral circuit region are present, the size, depth, and pitch of the features constituting the auxiliary pattern of the photomask can be changed to make the CDs of the lines and spaces more uniform.

EXPERIMENTAL EXAMPLE 3

As seen from Tables 2 through 4, the recesses 140 formed in the transmission regions 120 were responsible for the formation of a space pattern having CDs equal to or smaller (0.078-0.125 μm) than the size d (0.125 μm) of the transmission regions 120. In particular, it can be seen that a local or global CD variation correction is possible using the size, depth, and pitch of the recesses 140 as variables. Consequently, the simulations show that when a CD variation in a cell array region and a CD variation between the cell array region and a peripheral circuit region are present, the size, depth, and pitch of the features constituting the auxiliary pattern of the photomask can be changed to make the CDs of the lines and spaces more uniform.

Figure 9:
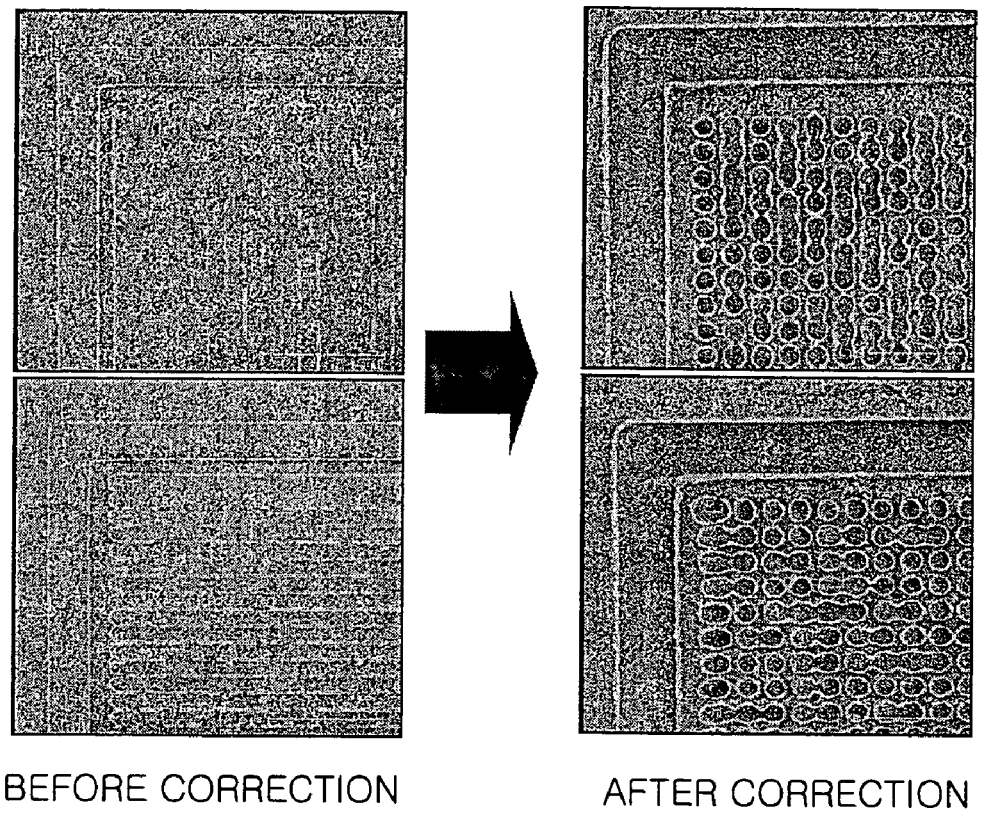
FIG. 9 are scanning electron microscopic (SEM) images that illustrate the correcting of an optical critical dimension (OCD) measurement pattern formed on a wafer using a photomask of the present invention.

The left-hand image of FIG. 9 is a SEM image that illustrates the detachment of OCD measurement patterns in a case in which 0.12 μm lines are reduced. The mask pattern of a photomask that will form such OCD measurement patterns must be repaired because these patterns may cause defects in subsequent processes. However, a conventional ion beam repair cannot provide global correction (even though a local correction is possible) and has a restricted number of applications.

Hence, in this Experimental Example, an 8% half-tone phase shift mask of the type shown in FIG. 4A was repaired/corrected by forming recesses (as an auxiliary pattern) in the transmission regions. More specifically, a laser was used to irradiate a photoresist, formed on the front side of the photomask, with light having a wavelength of 365 nm to expose 400 nm by 400 nm portions of the substrate. The exposed portions were etched to form the recesses 140. The depth of the recesses was selected so that the phase difference of 180 degrees occurred in light passing through the transmission regions 120 of the substrate.

As a result, a wafer exposed to light using the photomask thus repaired corrected the above-described detachment phenomenon, as shown in the right-hand image of FIG. 9. This is based on the fact that the phase difference produced by the recesses decreases the intensity of a light beam passing through the transmission regions, which increases the size of the line patterns. Thus, forming the auxiliary pattern on the front side of a photomask is a relatively simple way to repair the mask pattern to enhance the shot uniformity on a wafer.

EXPERIMENTAL EXAMPLE 4

Figure 10:
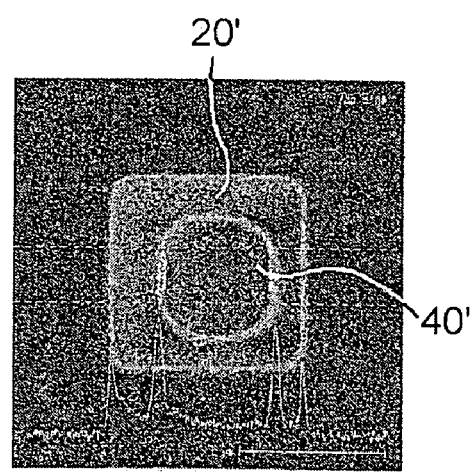
FIG. 10 is an image of a portion of a photomask according to the present invention in which an auxiliary pattern is formed in a 0.4 μm contact pattern.
Figure 11:
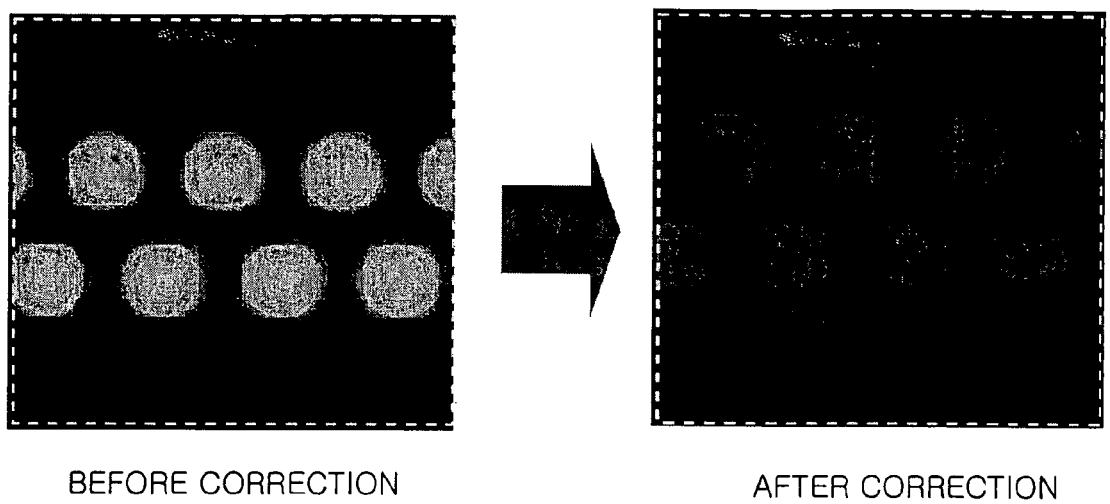
FIG. 11 shows a set of aerial images illustrating the use of the photomask of FIG. 10 to effect a no transfer ("not open" condition) of the contact pattern to a wafer.

FIGS. 10 and 11 show a correction that can be obtained by a photomask according to the present invention, wherein an auxiliary pattern of 0.15 μm recesses is formed amidst a 0.4 μm contact pattern to effect a phase difference of 180 degrees. FIG. 10 is a SEM image showing a 0.15 μm recess 40' formed in a transmission region 20' constituting a 0.4 μm contact pattern. FIG. 11 is a series of aerial images before and after correction, taken using an aerial image system (AIMS). It can be seen that the intensity of the light beam transmitted by the photomask was reduced by the correction.

This correction of the variations of the CDs enables a "no transfer" of the contact pattern to a wafer (also referred to as a "not open" condition). Thus, a method of manufacturing a photomask of the present invention can substitute for an ion beam photomask repair.

EXPERIMENTAL EXAMPLE 5

Figure 12:
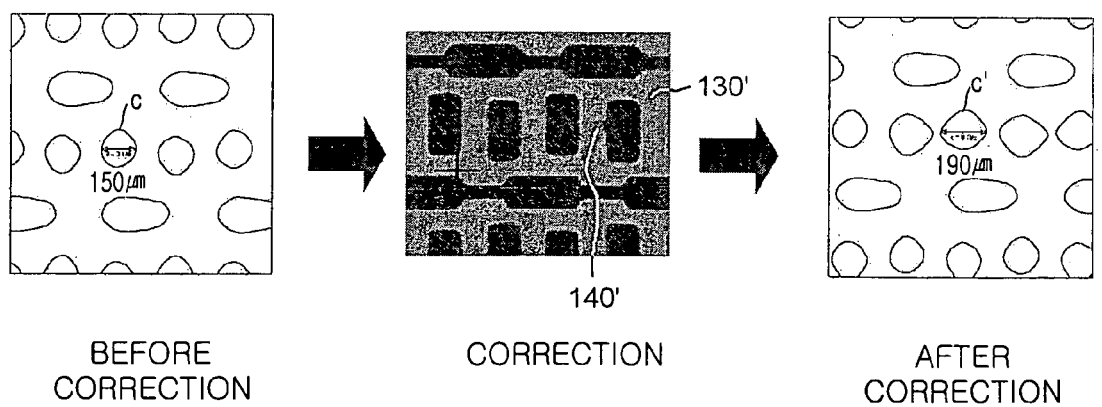
FIG. 12 is a series of images that illustrate a correction of the CD of a self-aligned contact (SAC) pad in a source/drain region of a dynamic random access memory (DRAM) using a photomask according to the present invention.

FIG. 12 illustrates the application of the present invention to forming self-aligned contact (SAC) pads in source/drain regions of a DRAM. A contact C formed using a photomask before correction had a CD of 150 μm. The photomask was then repaired/corrected (center of FIG. 12) by forming 0.05 μm holes 140' in the light-shielding film 130' defining the mask pattern. A contact C' formed using the corrected photomask had a CD of 190 μm.

A photomask according to the present invention, as described above, has an auxiliary pattern that precisely alters the intensity distribution of a light beam passing through the substrate of the photomask. The auxiliary pattern is formed on a front side of the photomask substrate by etching the photomask substrate or mask pattern. Thus, the repairing/correcting of the photomask will not damage the substrate, e.g., will not crack the substrate. The auxiliary pattern can be formed with such a degree of flexibility that a pattern formed on a wafer using the photomask can have a critical dimension (CD) uniformity, regardless of the locations on the wafer where the CD would otherwise vary from the target CD prior to the repair/correction of the photomask. Also, the features constituting the auxiliary pattern may be formed in different densities among various sections of the photomask to account for the fact that CD variations of a pattern transferred from a photomask to a wafer exhibit a tendency to be random.

Finally, although the present invention has been particularly shown and described with reference to the preferred embodiments thereof, it will be understood by those of ordinary skill in the art that various changes in form and details may be made thereto without departing from the true spirit and scope of the present invention as defined by the following claims.

What is claimed is:

1. A photomask comprising:
   a substrate transparent to exposure light emitted from a light source of optical exposure equipment and having a front side and a back side;
   a light-shielding film extending along the front side of the substrate and defining a mask pattern comprising a pattern of transmission regions through which the photomask transmits exposure light, the transmission regions being dedicated for use in forming a pattern on a substrate during a photolithography process in which the substrate is irradiated with the exposure light such that an image corresponding to the pattern of transmission regions is transmitted by the photomask; and
   an auxiliary pattern different from the mask pattern on the front side of the substrate, the auxiliary pattern comprising at least one recess in the substrate, each said at least one recess being located within one of the transmission regions so as to decrease the intensity of the light passing through the substrate, and
   each said at least one recess occupying a smaller area than the transmission region in which it is located.

2. The photomask of claim 1, wherein the auxiliary pattern comprises several recesses in the substrate.

3. The photomask of claim 2, wherein the transmission regions have shapes corresponding to those of contacts of a microelectronic device, and said recesses have the same shape as the transmission regions.

4. The photomask of claim 3, wherein each of the recesses is situated in the center of a respective one of the transmission regions.

5. The photomask of claim 2, wherein the photomask is divided into a plurality of equal sections, and the density of the recesses in one of the sections is different from that of the recesses in at least one other of the sections.

6. The photomask of claim 2, wherein the mask pattern is a pattern of alternating lines and spaces, the spaces forming the transmission regions, and several of the recesses are arrayed at a predetermined pitch in at least one of the transmission regions.

7. The photomask of claim 6, wherein several of the recesses are arrayed at a predetermined pitch in each of at least two of the transmission regions, and the density of the recesses arrayed in one of the transmission regions is different from that of the recesses arrayed in at least one other of the transmission regions.

8. The photomask of claim 1, wherein the auxiliary pattern is constituted by features having different sizes or shapes.

9. The photomask of claim 1, wherein only some of the transmission regions contain the auxiliary pattern such that the auxiliary pattern only occupies local areas of the substrate.

10. The photomask of claim 1, wherein the auxiliary pattern also comprises holes in the light-shielding film at the front side of the substrate that expose the substrate and thereby increase the intensity of the light passing through the substrate.

11. photomask comprising:
    a substrate transparent to exposure light emitted from a light source of optical exposure equipment and having a front side and a back side;
    a light-shielding film extending along the front side of the substrate and defining a mask pattern comprising a pattern of transmission regions through which the photomask transmits exposure light, the transmission regions being dedicated for use in forming a pattern on a substrate during a photolithography process in which the substrate is irradiated with the exposure light such that an image corresponding to the pattern of transmission regions is transmitted by the photomask; and an auxiliary pattern different from the mask pattern on the front side of the substrate, the auxiliary pattern being located within a region of the photomask delimited by said mask pattern, and wherein the auxiliary pattern is constituted by features each transparent to the exposure light so as to alter the intensity of the light passing through the substrate, and the features constituting the auxiliary pattern have different sectional areas or shapes from one another in the plane of the substrate.

12. The photomask of claim 11, wherein the transmission regions each have a shape corresponding to a contact of a microelectronic device, and each of the features constituting the auxiliary pattern has the same shape as but occupies a smaller area than any of the transmission regions.

13. The photomask of claim 12, wherein the features constituting the auxiliary pattern include recesses in the substrate.

14. The photomask of claim 13, wherein the features constituting the auxiliary pattern include holes in the light-shielding film, the holes exposing the substrate.

15. The photomask of claim 11, wherein the mask pattern is a pattern of lines and spaces, the spaces forming the transmission regions.

16. A photomask comprising:

a substrate transparent to exposure light emitted from a light source of optical exposure equipment and having a front side and a back side;

a light-shielding film extending along the front side of the substrate and defining a mask pattern comprising a pattern of transmission regions through which the photomask transmits exposure light, the transmission regions being dedicated for use in forming a pattern on a substrate during a photolithography process in which the substrate is irradiated with the exposure light such that an image corresponding to the pattern of transmission regions is transmitted by the photomask; and an auxiliary pattern different from the mask pattern on the front side of the substrate, the auxiliary pattern being located within a region of the photomask delimited by said mask pattern, and wherein the auxiliary pattern is constituted by at least one feature transparent to the exposure light so as to alter the intensity of the light passing through the substrate, each said at least one feature of the auxiliary pattern occupies a smaller area than any of the transmission regions of the mask pattern, and the at least one feature of the auxiliary pattern is distributed non-uniformly across the region of photomask delimited by said mask pattern so as to correct for local non-uniformity of critical dimensions of the pattern formed on a substrate using the photomask.

* * * * *